(12) United States Patent
Sakamoto

(10) Patent No.: US 9,643,257 B2
(45) Date of Patent: May 9, 2017

(54) CUTTING TOOL

(71) Applicant: KYOCERA Corporation, Kyoto-shi, Kyoto (JP)

(72) Inventor: Yoshiki Sakamoto, Satsumasendai (JP)

(73) Assignee: KYOCERA CORPORATION, Kyoto-Shi, Kyoto (JP)

( * ) Notice: Subject to any disclaimer, the term of this patent is extended or adjusted under 35 U.S.C. 154(b) by 213 days.

(21) Appl. No.: 14/410,572

(22) PCT Filed: Jun. 27, 2013

(86) PCT No.: PCT/JP2013/067687
§ 371 (c)(1),
(2) Date: Dec. 23, 2014

(87) PCT Pub. No.: WO2014/003131
PCT Pub. Date: Jan. 3, 2014

(65) Prior Publication Data
US 2015/0328690 A1    Nov. 19, 2015

(30) Foreign Application Priority Data
Jun. 27, 2012  (JP) ................. 2012-144360

(51) Int. Cl.
*B23B 27/14* (2006.01)
*C23C 14/06* (2006.01)
(Continued)

(52) U.S. Cl.
CPC ........ *B23B 27/148* (2013.01); *C23C 14/0664* (2013.01); *C23C 14/325* (2013.01);
(Continued)

(58) Field of Classification Search
USPC .......... 51/307, 309; 428/216, 457, 697, 698, 428/699
See application file for complete search history.

(56) References Cited

U.S. PATENT DOCUMENTS 5,272,014 A    12/1993  Leyendecker et al.
7,226,670 B2 *  6/2007  Derflinger ............. C23C 14/027
                                                                428/699
(Continued)

FOREIGN PATENT DOCUMENTS

EP    2737967 A1    6/2014
JP    H01190383 A   7/1989
(Continued)

OTHER PUBLICATIONS

Concise explanation of the Office Action issued in the corresponding Chinese Patent Application No. 201380030394.9 dated Nov. 4, 2015.
(Continued)

*Primary Examiner* — Archene Turner
(74) *Attorney, Agent, or Firm* — Viering, Jentschura & Partner mbB

(57) ABSTRACT

[Object] To provide a cutting tool having good chipping resistance and good wear resistance.
[Solution] Provided is a cutting tool 1 including a base body 2 whose surface is coated with a coating layer 6 made of $Cr_aM_{1-a}(C_{1-x}N_x)$ (here, M is at least one element selected from Ti, Al, Si, W, Mo, Ta, Hf, Nb, Zr, and Y, $0.01 \leq a \leq 0.4$, and $0 \leq x \leq 1$), a cutting edge 5 is formed on an intersection ridgeline between a rake face 3 and a flank face 4, and the coating layer 6 for the cutting edge 5 has a Cr content ratio greater than a Cr content ratio of the coating layer 6 for the flank face 4.

4 Claims, 3 Drawing Sheets

(51) Int. Cl.
*C23C 28/04* (2006.01)
*C23C 28/00* (2006.01)
*C23C 14/32* (2006.01)

(52) U.S. Cl.
CPC .......... *C23C 28/042* (2013.01); *C23C 28/044* (2013.01); *C23C 28/42* (2013.01); *Y10T 407/24* (2015.01)

(56) References Cited

U.S. PATENT DOCUMENTS

| | | | |
|---|---|---|---|
| 8,304,098 B2* | 11/2012 | Kubota | C23C 14/0641 428/697 |
| 9,085,032 B2* | 7/2015 | Sakamoto | C23C 30/005 51/307 |
| 2008/0229891 A1* | 9/2008 | Lechthaler | C23C 28/044 428/457 |
| 2009/0130434 A1* | 5/2009 | Zhu | C04B 35/58014 428/328 |
| 2012/0294686 A1 | 11/2012 | Ishida | |
| 2013/0022419 A1 | 1/2013 | Sakamoto et al. | |
| 2013/0022420 A1 | 1/2013 | Waki et al. | |
| 2013/0177361 A1 | 7/2013 | Waki et al. | |

FOREIGN PATENT DOCUMENTS

| | | |
|---|---|---|
| JP | H02080559 A | 3/1990 |
| JP | H08267306 A | 10/1996 |
| JP | H11077409 A | 3/1999 |
| JP | 2010-172972 * | 8/2010 |
| JP | 2010188512 A | 9/2010 |
| WO | 2011065540 A1 | 6/2011 |
| WO | 2011122553 A1 | 10/2011 |
| WO | 2011122554 A1 | 10/2011 |
| WO | 2012043459 A1 | 4/2012 |

OTHER PUBLICATIONS

International Search Report issued in the corresponding PCT International application No. PCT/JP2013/067687 dated Aug. 6, 2013, 2 pages.

European Search Report issued in the corresponding European patent application No. 13808492.6 dated Jan. 26, 2016.

* cited by examiner

CUTTING TOOL

RELATED APPLICATIONS

The present application is a national stage entry according to 35 U.S.C. §371 of PCT application No.: PCT/JP2013/067687 filed on Jun. 27, 2013, which claims priority from Japanese application No.: 2012-144360 filed on Jun. 27, 2012, and is incorporated herein by reference in its entirety.

TECHNICAL FIELD

The present invention relates to a cutting tool that is obtained by depositing a coating layer on a surface of a base body.

BACKGROUND ART

In recent years, the following materials have been used as the material of a base body for a cutting tool: a sintered alloy such as a cemented carbide alloy or cermet, a high-hardness sintered compact such as diamond or cubic boron nitride (cBN), and ceramics such as alumina or silicon nitride. A cutting tool with a coating layer on the surface of this base body is used. In the manufacturing of this cutting tool, a technique is used by which the coating layer is formed to improve wear resistance, slidability, and fracture resistance.

A physical vapor deposition such as an ion plating or a sputtering is used as an example of a method of forming the coating layer. A study on a coating layer made of nitride having Ti or Al as a main constituent is actively being conducted, and continuous improvement thereon is being made. In addition to a coating material, various innovations are applied to a cutting tool so as to cope with a change in cutting conditions such as an increase in cutting speed or the diversification of a workpiece.

For example, in a cutting tool disclosed in PTL 1 and PTL 2, the surface of a base body is coated with a film made of TiAlN or the like using the ion plating, and a coating film for a cutting edge of the cutting tool has a ratio of Ti greater than that of a flat portion of the cutting tool by increasing the absolute value of a negative bias applied during a film deposition in a later phase of the film deposition after an initial phase thereof.

CITATION LIST

Patent Literature

PTL 1: Japanese Unexamined Patent Application Publication No. 01-190383
PTL 2: Japanese Unexamined Patent Application Publication No. 08-267306

SUMMARY OF INVENTION

Technical Problem

However, in the cutting tool disclosed in PTL 1 and PTL 2, the TiAlN film for the cutting edge having a high ratio of Ti cannot sufficiently protect the cutting edge from chipping, and wear may increase rapidly due to the occurrence of chipping. For this reason, the life of the tool is not stably extended.

The present invention is made to solve the problem, and an object of the present invention is to provide a cutting tool with a coating layer which can produce good cutting performance via the optimization of the composition of the coating layer for a cutting edge and a flank face.

Solution to Problem

In a cutting tool of the present invention, a surface of a base body is coated with a coating layer made of $Cr_aM_{1-a}(C_{1-x}N_x)$ (here, M is at least one element selected from Ti, Al, Si, W, Mo, Ta, Hf, Nb, Zr, and Y, $0.01 \leq a \leq 0.4$, and $0 \leq x \leq 1$). A cutting edge is formed on an intersection ridgeline between a rake face and a flank face. The coating layer for the cutting edge has a Cr content ratio greater than a Cr content ratio of the coating layer for the flank face.

Advantageous Effects of Invention

In the configuration of a cutting tool of the present invention, a surface of a base body is covered with a coating layer containing Cr, and the coating layer for a cutting edge has a Cr content ratio greater than that of the coating layer for a flank face. Accordingly, it is possible to prevent a workpiece from adhering to the cutting edge, and it is possible to increase the fracture resistance of the cutting edge. As a result, it is possible to prevent the occurrence of chipping of the cutting edge. Moreover, since it is possible to increase the wear resistance of the flank face, the life of the tool is extended.

BRIEF DESCRIPTION OF DRAWINGS

FIG. 1A is a schematic perspective view, and FIG. 1B is a cross-sectional view taken along line X-X in FIG. 1A.

DESCRIPTION OF EMBODIMENTS

Figure 1A:
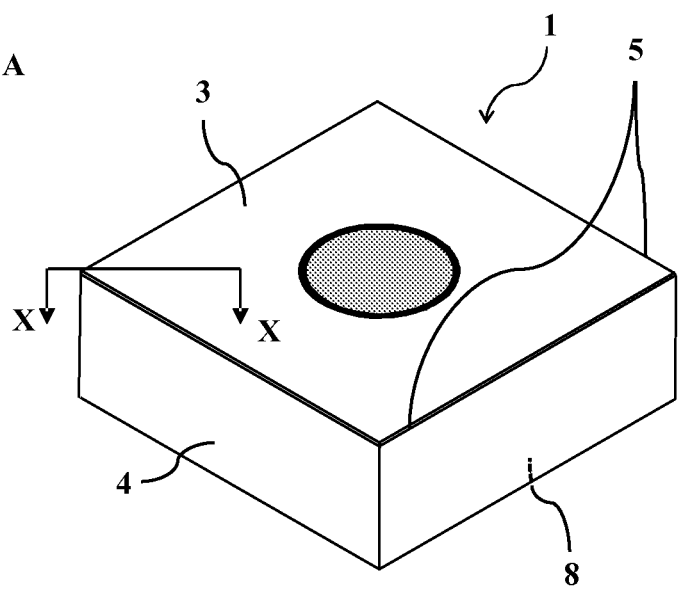
FIGS. 1A and 1B illustrate an example of a cutting tool of the present invention.
Figure 1B:
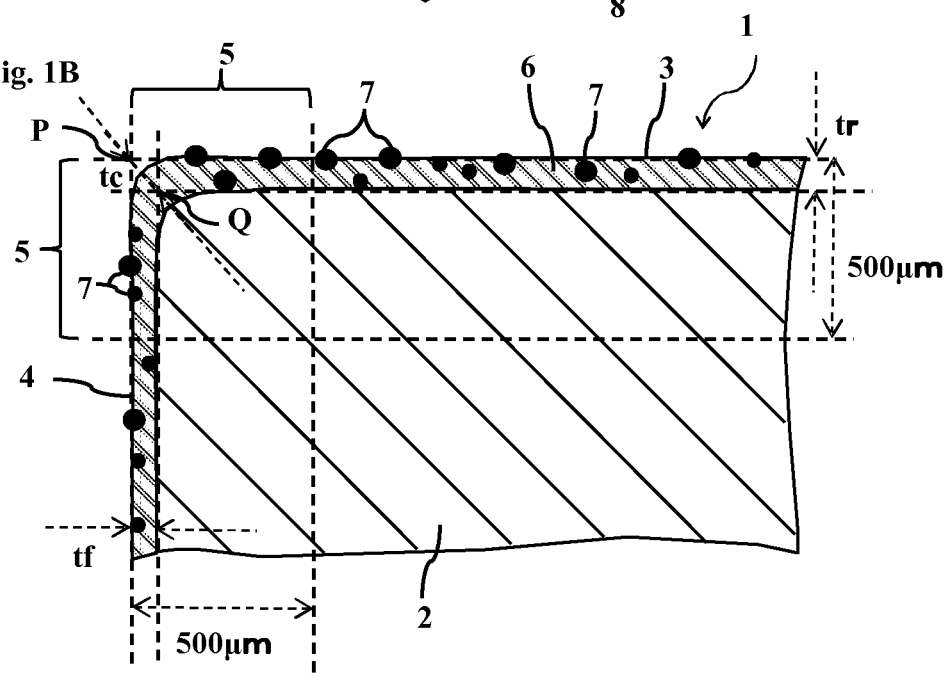

A preferred embodiment of a cutting tool of the present invention will be described with reference to FIGS. 1A and 1B (FIG. 1A is a schematic perspective view and FIG. 1B is a cross-sectional view taken along line X-X in FIG. 1A).

In FIGS. 1A and 1B, a cutting tool 1 has a rake face 3 on a main surface; a flank face 4 on a side surface; a cutting edge 5 on an intersection ridgeline between the rake face 3 and the flank face 4, and a coating layer 6 on the surface of a base body 2. A main surface opposite to the rake face 3 is a seating face 8.

The coating layer 6 is made of $Cr_aM_{1-a}(C_{1-x}N_x)$ (here, M is at least one element selected from Ti, Al, Si, W, Mo, Ta, Hf, Nb, Zr, and Y, and $0.01 \leq a \leq 0.4$, and $0 \leq x \leq 1$).

In the cutting tool 1 of the embodiment, the coating layer 6 for the cutting edge 5 has a Cr content ratio greater than that of the coating layer 6 for the flank face 4. In the embodiment, the Cr content ratio of the coating layer 6 increases gradually from the flank face 4 to the cutting edge 5. Accordingly, it is possible to prevent a workpiece from adhering to the cutting edge 5, and to increase the fracture resistance of the cutting edge 5. As a result, it is possible to prevent the occurrence of chipping of the cutting edge 5, and to increase the wear resistance of the flank face 4.

Here, the specific composition of the coating layer 6 for each of the rake face 3, the flank face 4, and the cutting edge 5 is $Cr_aM_{1-a}(C_{1-x}N_x)$ (here, M is at least one element selected from Ti, Al, Si, W, Mo, Ta, Hf, Nb, Zr, and Y, and $0.01 \leq a \leq 0.4$, and $0 \leq x \leq 1$). When a (a chromium metal composition ratio) is less than 0.01 in the coating layer 6, the oxidation resistance and the lubricity of the coating layer 6 decrease. When a (chromium metal composition ratio) is greater than 0.4, the wear resistance of the coating of the coating layer 6 decreases. The particularly preferred range of a is $0.04 \leq a \leq 0.15$.

M is one or more element selected from Ti, Al, Si, W, Mo, Ta, Hf, Nb, Zr, and Y, and when M contains one or more element among Ti, Al, Si, Nb, Mo, and W, it is possible to increase the hardness of the coating layer 6, and to obtain a good wear resistance. When M contains Ti, Al, Nb, or Mo among these constituent elements, the coating layer 6 has good oxidation resistance at a high temperature. For this reason, for example, it is possible to prevent crater wear from progressing during a high-speed cutting process.

In the embodiment, an example of a more specific composition of the coating layer 6 is $Cr_aTi_bAl_cNb_dW_e(C_{1-x}N_x)$ ($0.01 \leq a \leq 0.4$, $0.2 \leq b \leq 0.8$, $0 \leq c \leq 0.6$, $0 \leq d \leq 0.25$, $0 \leq e \leq 0.25$, $a+b+c+d+e=1$, and $0 \leq x \leq 1$). When the composition of the coating layer 6 falls into this range, the temperature of the coating layer 6 at which oxidation starts increases, and thereby the oxidation resistance increases. In addition, it is possible to decrease the internal stress of the coating layer, and thereby the fracture resistance increases. Moreover, the hardness of the coating layer 6 is high and the adherence of the coating layer 6 to the base body 2 is good. For this reason, the coating layer 6 has good wear resistance and good fracture resistance even under severe cutting conditions, for example, when machining a difficult-to-cut workpiece, or during a dry cutting process or a high-speed cutting process.

That is, when b (a Ti composition ratio) is greater than or equal to 0.2, the crystal structure of the coating layer 6 changes from a cubic crystal structure to a hexagonal crystal structure, thereby the hardness does not decrease, and the wear resistance increases. When b (Ti composition ratio) is less than or equal to 0.8, the oxidation resistance and the heat resistance of the coating layer 6 increase. The particularly preferred range of b is $0.4 \leq b \leq 0.5$. In addition, when c (an Al composition ratio) is less than or equal to 0.6, the crystal structure of the coating layer 6 becomes a cubic crystal structure, and the hardness does not decrease because a change of the crystal structure from a cubic crystal structure to a hexagonal crystal structure does not occur. The particularly preferred range of c is $0.45 \leq c \leq 0.52$. When d (an Nb composition ratio) is less than or equal to 0.25, the oxidation resistance and the hardness of the coating layer 6 do not decrease, and the wear resistance increases. The particularly preferred range of d is $0.02 \leq d \leq 0.22$. When e (a W composition ratio) is less than or equal to 0.25, the oxidation resistance and the hardness of the coating layer 6 do not decrease, and the wear resistance increases. The particularly preferred range of e is $0.02 \leq e \leq 0.22$.

In addition to the above-mentioned compositions, the coating layer 6 may contain less than 5 atom % of at least one element selected from Si, Mo, Ta, Hf, Zr, and Y.

C and N which are non-metal constituents of the coating layer 6 provide good hardness and good toughness necessary for the cutting tool. In the embodiment, x (an N composition ratio) is $0 \leq x \leq 1$. When x is in this range, both wear resistance and fracture resistance of the coating layer 6 increase. Even in this range, x is preferably $0.9 \leq x \leq 1$. Here, in the present invention, it is possible to measure the composition of the coating layer 6 using an electron probe micro-analyzer (EPMA) or an X-ray photoelectron spectroscopy (XPS).

In the embodiment, the coating layer 6 for the cutting edge 5 has a Cr content ratio greater than that of the coating layer 6 for the rake face 3. In particular, in the embodiment, the Cr content ratio of the coating layer 6 increases gradually from the rake face 3 to the cutting edge 5. Accordingly, it is possible to prevent a workpiece from adhering to the coating layer 6 for the cutting edge 5, and the toughness of the cutting edge 5 improves. As a result, it is possible to prevent the occurrence of chipping of the cutting edge 5. However, the hardness of the rake face 3 increases, and it is possible to prevent crater wear of the rake face 3 from progressing.

Figure 2:
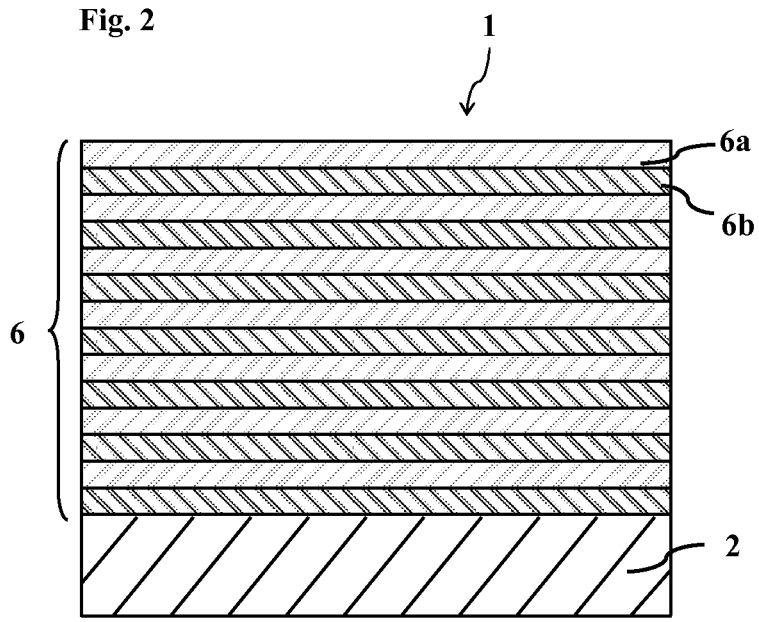
FIG. 2 is an enlarged view illustrating main portions of an example of a coating layer of the cutting tool illustrated in FIGS. 1A and 1B.

In the embodiment, as illustrated in FIG. 2 (an enlarged view illustrating main portions of an example of the coating layer 6), the coating layer 6 has a multiple-layer structure in which first coating layers 6a containing Cr and second coating layers 6b not containing Cr are alternately stacked on each other. Accordingly, it is possible to prevent a crack inside the coating layer 6 from progressing, and the hardness of the entirety of the coating layer 6 increases, and the wear resistance improves. When the coating layer is configured to include multiple layers of two types or more having different compositions, the composition of the coating layer 6 is expressed as a total composition. Specifically, when the composition of the coating layer 6 is analyzed with an electron probe micro-analyzer (EPMA) or the like, an analyzed region spans a range across the entire thickness of the coating layer 6 containing all the layers. For example, when forming the coating layer 6 having such a multiple-layer structure, it is possible to manufacture a cutting tool by depositing a film while rotating a specimen subjected to film deposition, in a state where different compositions of targets are disposed on an inner side wall surface of a chamber of a film deposition apparatus with a constant gap interposed between the adjacent targets.

In the composition of the coating layer 6 of the embodiment, the coating layer 6 for the rake face 3 has a Cr content ratio greater than that of the coating layer 6 for the flank face 4. Accordingly, the lubricity of the rake face 3 improves, and it is possible to prevent the occurrence of crater wear of the rake face 3, and the chip discharging properties improve. The hardness of the flank face 4 increases, and it is possible to prevent the occurrence of wear of the flank face.

In the present invention, a range of the cutting edge 5 used for specifying the composition or the thickness of the coating layer 6 is defined by a region, the width of which is 500 μm from the intersection ridgeline between the rake face 3 and the flank face 4. Accordingly, the range of the rake face 3 is a region from the center of the rake face 3 to a position that is distant from the intersection ridgeline by 500 μm on the main surface of the cutting tool 1, in which the intersection ridgeline is an end edge of the cutting edge 5. The range of the flank face 4 is a region from the center of the flank face 4 to a position that is distant from the intersection ridgeline by 500 μm on the side surface of the cutting tool 1, in which the intersection ridgeline is an end edge of the cutting edge 5.

In the embodiment, according to the composition formula $Cr_aTi_bAl_cNb_dW_e(C_{1-x}N_x)$, the composition of the coating layer 6 for the cutting edge 5 is as follows: $0.02 \leq a \leq 0.4$, $0.24 \leq b \leq 0.8$, $0 \leq c \leq 0.56$, $0 \leq d \leq 0.25$, $0 \leq e \leq 0.25$, $a+b+c+d+e=1$, and $0 \leq x \leq 1$. In the embodiment, according to the composition formula $Cr_aTi_bAl_cNb_dW_e(C_{1-x}N_x)$, the composition of the coating layer 6 for the flank face 4 is as follows: $0.015 \leq a \leq 0.35$, $0.24 \leq b \leq 0.79$, $0 \leq c \leq 0.58$, $0 \leq d \leq 0.25$, $0 \leq e \leq 0.25$, $a+b+c+d+e=1$, and $0 \leq x \leq 1$. In the embodiment, according to the composition formula $Cr_aTi_bAl_cNb_dW_e(C_{1-x}N_x)$, the composition of the coating layer 6 for the rake face 5 is as follows: $0.01 \leq a \leq 0.3$, $0.23 \leq b \leq 0.78$, $0 \leq c \leq 0.6$, $0 \leq d \leq 0.25$, $0 \leq e \leq 0.25$, $a+b+c+d+e=1$, and $0 \leq x \leq 1$.

In the embodiment, a ratio (tc/tf) is a ratio between a thickness tf of the coating layer 6 for the flank face 4 and a thickness tc of the coating layer 6 for the cutting edge 5, and is 1.10 to 3.00. Accordingly, it is possible to maintain the balance between the chipping resistance of the cutting edge 5 and the wear resistance of the flank face 4, and to increase the life of the tool.

Here, in the embodiment, the thickness tf of the coating layer 6 for the flank face 4 is greater than the thickness tr of the coating layer 6 for the rake face 3. Accordingly, the wear resistance of the flank face 4 improves, and thereby it is possible to extend the life of the tool. In the embodiment, a ratio (tf/tr) is a ratio between the thickness tf of the coating layer 6 for the flank face 4 and a thickness tr of the coating layer 6 for the rake face 3, and is 1.50 to 3.00. The thickness tf of the coating layer 6 for the flank face 4 is the thickness of the coating layer 6 which is measured at the center of the flank face 4. The thickness tr of the coating layer 6 for the rake face 3 is the thickness of the coating layer 6 which is measured at the center (a position in front of the attachment hole 9 when an attachment hole 9 is provided at the center of the rake face 3 as illustrated in FIG. 1A) of the rake face 3. The thickness tc of the coating layer 6 for the cutting edge 5 is the thickness of the coating layer 6 which is measured on a straight line that passes through an intersection point P and an intersection point Q. Here, the intersection point P is an intersection point of the respective imaginary extension lines of the rake face 3 and the flank face 4, both of which contain the coating layers 6, and the intersection point Q is an intersection point of the respective imaginary extension lines of the rake face 3 and the flank face 4, none of which contains the coating layer 6.

In the embodiment, as illustrated in FIG. 1B, a plurality of particulate matters referred to as droplets 7 are present on the surface of and inside the coating layer 6. In the embodiment, an average composition of the plurality of droplets 7 of the rake face 3 contains a Cr content ratio greater than that of the droplets 7 of the flank face 4.

In this configuration, even when chips pass through the rake face 3 during a cutting process, the chips do not come in full contact with the rake face by virtue of the existence of the droplets 7, that is, the chips do not come in contact with a wide area of the rake face, and thereby this prevents an increase in the temperature of the surface of the coating layer 6. Moreover, since the droplets 7 of the rake face 3 have a Cr content ratio greater than that of the droplets 7 of the flank face 4, the droplets 7 of the rake face 3 have high lubricity, and can be also supplied as a cutting fluid to the surface of the coating layer 6. Since the droplets 7 of the flank face 4 have a low Cr content ratio, and are fragile, the droplets 7 are removed and disappear from the flank face 4 early on, and thereby this results in an improvement in the state of a machined surface during finishing.

In the embodiment, a ratio $Cr_{DR}/Cr_{DF}$ is the ratio between a Cr content ratio $Cr_{DR}$ of the droplets 7 of the rake face 3 of the coating layer 6 and a Cr content ratio $Cr_{DF}$ of the droplets 7 of the flank face 4, and the ratio $Cr_{DR}/Cr_{DF}$ is as follows: $1.05 \leq Cr_{DR}/Cr_{DF} \leq 1.60$. Accordingly, it is possible to optimize the wear resistance of both the rake face 3 and the flank face 4.

In the embodiment, the number of droplets 7 having a diameter of 0.2 μm or greater is 15 to 50 per a 10 μm×10 μm region of the rake face 3, and is preferably 18 to 30. Accordingly, it is possible to reduce the generation of heat resulting from the passing-through of chips. In the embodiment, the number of droplets 7 of the rake face 3 is greater than that of the flank face 4. Accordingly, it is possible to prevent the passing-through of chips from causing an increase in the temperature of the rake face 3, and to improve the grade of a machined surface by smoothing the flank face 4. The abundance of the droplets 7 is determined by observing a 10 μm×10 μm region of the surface of the coating layer 6, specifying the droplets 7 having a diameter of 0.2 μm or greater in the observed region, and counting the number thereof. The abundance of the droplets 7 is an average value of the number of droplets 7 in three arbitrarily observed regions. In determining the composition of the droplets 7, the composition of each of the droplets 7 is measured with an EPMA, and the composition of the droplets 7 is an average value of the composition of ten arbitrary droplets 7 having a diameter of 0.2 μm or greater which are observed in a 10 μm×10 μm region of one visual field.

In the embodiment, a ratio $Al_{DR}/Al_{DF}$ is a ratio between an Al content ratio $Al_{DR}$ of the droplet 7 formed on the rake face 3 of the coating layer 6 and an Al content ratio $Al_{DF}$ of the droplet 7 formed on the flank face 4 of the coating layer 6, and the ratio $Al_{DR}/Al_{DF}$ is as follows: $1.00 \leq Al_{DR}/Al_{DF} \leq 1.10$. Accordingly, it is possible to optimize the wear resistance of both the rake face 3 and the flank face 4. The particularly preferred range of the ratio $Al_{DR}/Al_{DF}$ is as follows: $1.00 \leq Al_{DR}/Al_{DF} \leq 1.02$. In the embodiment, a ratio $Ti_{DR}/Ti_{DF}$ is a ratio between a Ti content ratio $Ti_{DR}$ of of the droplet 7 formed on the rake face 3 of the coating layer 6 and a Ti content ratio $Ti_{DF}$ of the droplet 7 formed on the flank face 4 of the coating layer 6, and the ratio $Ti_{DR}/Ti_{DF}$ is as follows: $0.91 \leq Ti_{DR}/Ti_{DF} \leq 0.97$. Accordingly, it is possible to optimize the chipping resistance of both the rake face 3 and the flank face 4. The particularly preferred range of the ratio $Ti_{DR}/Ti_{DF}$ is as follows: $0.94 \leq Ti_{DR}/Ti_{DF} \leq 0.97$.

Figure 3A:
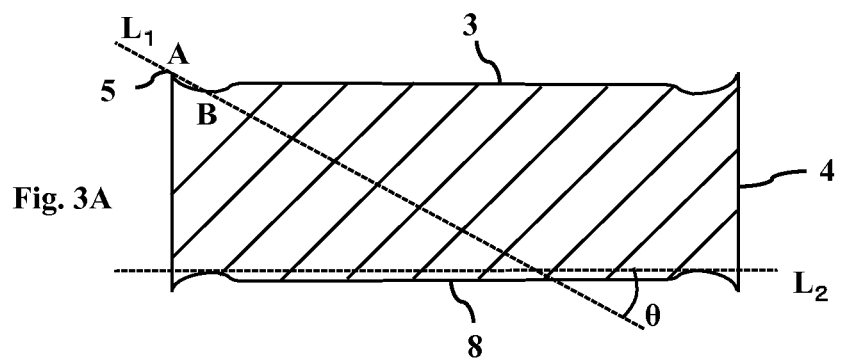
FIGS. 3A and 3B are views illustrating a method of calculating a back rake angle.
Figure 3B:
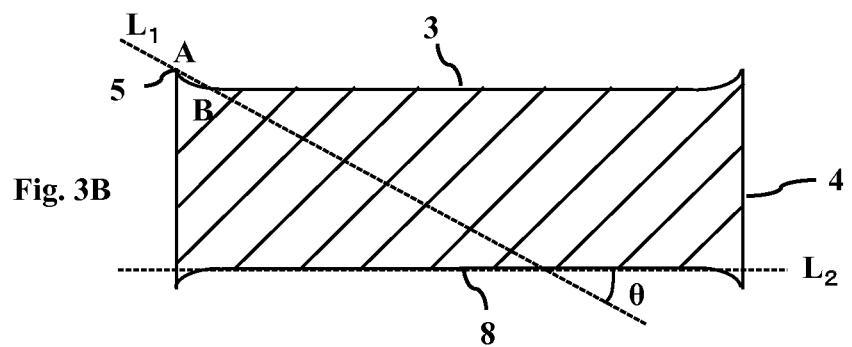

Here, the cutting tool 1 illustrated in FIGS. 1A and 1B has a substantially rectangular main surface, and an angle formed by the main surface and the side surface is 90°, that is, the cutting tool 1 has a simple plate-like shape (for example, a CNMA or a CNMG of ISO standard 13399), having a relief angle of 0°; however, the present invention is not limited to the shape in the embodiment. For example, the cutting tool 1 may have a shape (for example, an SNKN shape of ISO standard 13399) having a positive relief angle (an angle for making a space between the flank face 4 and the workpiece during a cutting process, that is, an angle formed by the flank face 4 and a plane perpendicular to a mounting face of the seating face 8 which is mounted on a holder). The rake face 3 may not be a flat surface, and may have a shape in which an end portion thereof protrudes, or a breaker is provided. In particular, in a case where a back rake angle θ is 20° to 50°, since a difference in the composition of the deposited coating layer 6 becomes significant due to the difference in the ability to hold a straight line of each element during the deposition of the coating layer 6, it is easy to control the Cr content ratio of the coating layer 6 for each of the flank face 4 and the cutting edge 5 to be in a predetermined range. As illustrated in FIGS. 3A and 3B, in a cross section that passes through the center of each of the cutting edge 5 and the rake face 3 of the cutting tool 1, a straight line $L_1$ connects the cutting edge 5 (point A) and the lowest point (point B) on the rake face 3, and a straight line $L_2$ is parallel with the mounting face of the seating face 8 which is mounted on the holder, and the back rake angle θ is defined by an angle formed by the straight line $L_1$ and the straight line $L_2$. As illustrated in FIG. 3B, when a plurality of the lowest points are present on the rake face 3 (the lowest countless points are present in the form of straight line in FIG. 3B), the point B refers to a point of the lowest points which is closest to the cutting edge, and the back rake angle θ is obtained from the point B defined in this manner. In the embodiment, when the back rake angle θ is 40° to 50°, it becomes easier to control the Cr content ratio of the coating layer 6 for each of the flank face 4 and the cutting edge 5, and it is possible to increase the adhesion resistance, the fracture resistance, and the wear resistance of the cutting tool 1.

The following materials can be suitably used as the material of the base body 2: a cemented carbide alloy composed of a hard phase of a main constituent such as tungsten carbide or titanium carbonitride and a binder phase of an iron-group metal such as cobalt or nickel as a main constituent; and a hard cermet alloy. In addition, the following hard materials are used as the material of the base body 2: ceramics having silicon nitride or aluminum oxide as a main constituent; and an ultra-high pressure sintered compact that is obtained by sintering a hard phase of polycrystalline diamond or cubic boron nitride and a binder phase of ceramics or an iron-group metal under ultra high pressure.

Manufacturing Method

Subsequently, a method of manufacturing the cutting tool of the present invention will be described.

First, a base body having the shape of the tool is manufactured using a method in the related art. Subsequently, a coating layer is deposited on the surface of the base body. A physical vapor deposition (PVD) such as the ion plating or the sputtering is suitably applicable as a method of depositing the coating layer. An example of the film deposition will be described in detail. When the coating layer is formed using an arc ion plating, metal targets that contain chromium metal (Cr) and a predetermined metal M (here, M is at least one element selected from Ti, Al, Si, W, Mo, Ta, Hf, Nb, Zr, and Y), respectively, composite alloy targets, or sintered compact targets are set on the side wall surface of the chamber.

At this time, a center magnet is installed around the target so as to be positioned at the center of the back surface of the target. According to the present invention, it is possible to manufacture the cutting tool of the embodiment by controlling the strength of the magnetic force of the magnet. That is, the magnetic force of the center magnet installed around a target containing Cr is increased, and the magnetic force of the center magnet of a target not containing Cr is decreased. Accordingly, the state of diffusion of metal ions originating from each of the targets changes, and the state of the distribution of the metal ions in the chamber changes. The state of diffusion of the metal ions, that is, the ability to hold a straight line of the metal ions flying out of a target changes depending on the type of metal. As a result, it is possible to change the ratios of metal contained in the coating layer to be deposited on the surface of the base body, and the state of existence of droplets.

The deposition of the coating layer and the droplets is carried out using these targets via the ion plating according to which metal sources vaporize and ionize due to arc discharge or glow discharge, and concurrently react with a nitrogen ($N_2$) gas of a nitrogen source or a methane ($CH_4$)/acetylene ($C_2H_2$) gas of a carbon source, or the sputtering. At this time, the position of the base body is set in such a manner that the flank face is substantially parallel with the side surface of the chamber, and the rake face is substantially parallel with an upper surface of the chamber. At this time, the film deposition is carried out while a magnetic force of 2 T to 8 T is applied to the center magnets. The film deposition is carried out while a magnetic force applied to the center magnet installed around the target containing Cr is set to be greater than a magnetic force applied to the center magnet installed around the target not containing Cr.

In the embodiment, when the coating layer is deposited, a bias voltage of 35 V to 200 V is applied so as to be able to form a high-hardness coating layer, and to increase the adherence of the coating layer to the base body.

EXAMPLE 1

A throwaway green tipped compact having the shape (back rake angle 16° and relief angle 18°) of a cutting tool BDMT11T308TR-JT made by Kyocera Co. was formed by adding 10% by mass of metallic cobalt (Co) powder having an average particle diameter of 1.2 μm, 0.1% by mass of vanadium carbide (VC) powder having an average particle diameter of 1.0 μm, and 0.3% by mass of chromium carbide ($Cr_3C_2$) powder having an average particle diameter of 1.0 μm to tungsten carbide (WC) powder having an average particle diameter of 0.8 μm which is a main constituent, mixing together the powders, and press-forming the powders. A cemented carbide alloy was manufactured by setting the green compact in a firing furnace, applying a debinding treatment to the green compact, and firing the green compact in a vacuum of 0.01 Pa at 1450° C. for one hour. The surface of a rake face of each specimen was subjected to abrasive machining such as blasting or brushing. In addition, an edge sharpening treatment (horning) via brushing was applied to the manufactured cemented carbide alloy.

With respect to the base body manufactured in this manner, a center magnet illustrated in Table 1 was set for each of a first target not containing Cr and a second target containing Cr. The bias voltages illustrated in Table 1 were applied to the center magnets, the arc currents illustrated in Table 1 flowed through the center magnets, and coating layers, each of which had a composition illustrated in Tables 2 and 3, were deposited at a film deposition temperature of 540° C. The composition of each of the coating layers was measured using the following method.

Three arbitrary positions on the surface of a coating layer for each of a rake face, a cutting edge, and a flank face of the obtained test specimen were observed using a scanning electron microscope (SEM), and the composition of the coating layer for each of the rake face, the cutting edge, and the flank face was analyzed using an EPMA. An average composition for the three positions of the coating layer for each of the rake face, the flank face, and the cutting edge was denoted as the composition for each position of the coating layer. Any one of the test specimens had a multiple-layer structure in which coating layers containing a small amount of Cr and coating layers containing a large amount of Cr were alternately stacked on each other, with a gap of 20 nm to 100 nm interposed between the adjacent layers.

From the observation with the SEM, the number of droplets having a diameter of 0.2 μm or greater were measured in an arbitrary 10 μm×10 μm region of each of the rake face and the flank face, and an average value of the number of droplets for five measured positions was calculated. The respective compositions of ten droplets observed in one visual field were measured using energy dispersive spectrometry (EDS) (EDAX made by AMETEK), and an average value of the measured compositions was calculated as an average composition of the droplets of the coating layer for each of the rake face and the flank face. In the tables, an average Cr content amount (atom %), an average Al content amount, and an average Ti content amount of the droplets of the rake face were respectively denoted as $Cr_{DR}$, $Al_{DR}$, and $Ti_{DR}$, and an average Cr content amount (atom %), an average Al content amount, an average Ti content amount of the droplets of the flank face were respectively denoted as $Cr_{DF}$, $Al_{DF}$, and $Ti_{DF}$. In addition, a cross section of each of the test specimens which contains the coating layer was observed using the SEM, and the thickness of the coating layer for each of the cutting edge, the rake face, and the flank face was measured. Table 2 illustrates the composition and the thickness tr of the rake face, and the composition and the thickness tc of the cutting edge, Table 3 illustrates the composition and the thickness tf, the ratio tc/tf, and the ratio tf/tr, and Table 4 illustrates the number of droplets and the composition of each of the rake face and the flank face, and a composition ratio between the composition of droplets of the rake face and the composition of the droplets of the flank face.

Subsequently, cutting tests were carried out using the obtained throwaway tips under the following cutting conditions. Table 4 illustrates the results.
cutting method: milling
workpiece: carbon steel (S45C)
cutting speed: 200 m/min
feeding speed: 0.1 mm/rev
cutting depth: 2.0 mm
cutting state: dry cutting evaluation method: after 500 workpieces were machined, a cutting tool was observed to confirm the state of the adhesion of the workpieces to a cutting edge. The number of machinable workpieces before the cutting tool was brought into a non-machinable state was confirmed, and at that point, the pattern of wear of a flank face was confirmed.

TABLE 1

| Test Specimen No | First Target Composition | Magnetic Force (T) | Current (A) | Second Target Composition | Magnetic Force (T) | Current (A) | Bias Voltage (V) |
|---|---|---|---|---|---|---|---|
| 1 | TiAlWNbSi | 5 T | 150 | AlCr | 8 T | 150 | 75 |
| 2 | TiAlW | 2 T | 150 | AlCr | 6 T | 150 | 100 |
| 3 | TiNb | 2 T | 150 | Cr | 5 T | 150 | 150 |
| 4 | TiAlNb | 5 T | 150 | AlCrNb | 9 T | 150 | 50 |
| 5 | TiAlY | 3 T | 150 | CrW | 7 T | 150 | 100 |
| 6 | TiAlNb | 4 T | 150 | AlCrSi | 8 T | 150 | 50 |
| 7 | TiAlNb | 4 T | 150 | Cr | 7 T | 150 | 150 |
| 8 | TiAlWSiNb | 8 T | 150 | Cr | 5 T | 150 | 75 |
| 9 | TiAlCrSi | 5 T | 150 | Cr | 5 T | 150 | 100 |

TABLE 2

| Test Specimen No | Coating Layer Composition of Rake Face | Thickness tr (μm) | Coating Layer Composition of Cutting Edge | Thickness tc (μm) |
|---|---|---|---|---|
| 1 | $Ti_{0.25}Al_{0.52}Nb_{0.03}Cr_{0.18}W_{0.01}Si_{0.01}N$ | 2.3 | $Ti_{0.33}Al_{0.41}Nb_{0.02}Cr_{0.22}W_{0.01}Si_{0.01}N$ | 4.5 |
| 2 | $Ti_{0.43}Al_{0.33}Cr_{0.19}W_{0.05}N$ | 2.8 | $Ti_{0.44}Al_{0.31}Cr_{0.20}W_{0.05}N$ | 3.4 |
| 3 | $Ti_{0.75}Nb_{0.09}Cr_{0.16}N$ | 1.3 | $Ti_{0.73}Nb_{0.10}Cr_{0.17}N$ | 4.1 |
| 4 | $Ti_{0.30}Al_{0.62}Nb_{0.03}Cr_{0.05}N$ | 1.9 | $Ti_{0.32}Al_{0.58}Nb_{0.03}Cr_{0.07}N$ | 4.6 |
| 5 | $Ti_{0.46}Al_{0.47}Cr_{0.06}Y_{0.01}N$ | 2.5 | $Ti_{0.47}Al_{0.41}Cr_{0.11}Y_{0.01}N$ | 4.8 |
| 6 | $Ti_{0.42}Al_{0.45}Cr_{0.08}Si_{0.05}N$ | 2.1 | $Ti_{0.41}Al_{0.45}Cr_{0.10}Si_{0.04}N$ | 4.5 |
| 7 | $Ti_{0.46}Al_{0.43}Nb_{0.01}Cr_{0.10}N$ | 2.0 | $Ti_{0.44}Al_{0.45}Nb_{0.03}Cr_{0.08}N$ | 4.3 |
| 8 | $Ti_{0.30}Al_{0.51}Nb_{0.04}Cr_{0.12}W_{0.01}Si_{0.02}N$ | 2.2 | $Ti_{0.30}Al_{0.51}Nb_{0.04}Cr_{0.11}W_{0.01}Si_{0.03}N$ | 4.5 |
| 9 | $Ti_{0.41}Al_{0.52}Cr_{0.04}Si_{0.03}N$ | 1.9 | $Ti_{0.41}Al_{0.52}Cr_{0.04}Si_{0.03}N$ | 4.3 |

TABLE 3

| Test Specimen No | Coating Layer Composition of Flank Face | Thickness tf (μm) | tc/tf | tf/tr |
|---|---|---|---|---|
| 1 | $Ti_{0.25}Al_{0.55}Nb_{0.03}Cr_{0.15}W_{0.01}Si_{0.01}N$ | 3.2 | 1.41 | 1.39 |
| 2 | $Ti_{0.46}Al_{0.30}Cr_{0.19}W_{0.05}N$ | 3.2 | 1.06 | 1.14 |
| 3 | $Ti_{0.74}Nb_{0.10}Cr_{0.16}N$ | 1.3 | 3.15 | 1.00 |
| 4 | $Ti_{0.30}Al_{0.64}Nb_{0.03}Cr_{0.03}N$ | 3.8 | 1.21 | 2.00 |
| 5 | $Ti_{0.45}Al_{0.5}Cr_{0.04}Y_{0.01}N$ | 3.0 | 1.50 | 1.20 |
| 6 | $Ti_{0.40}Al_{0.49}Cr_{0.07}Si_{0.04}N$ | 2.3 | 1.96 | 1.10 |
| 7 | $Ti_{0.45}Al_{0.45}Nb_{0.03}Cr_{0.07}N$ | 2.4 | 1.79 | 1.20 |
| 8 | $Ti_{0.30}Al_{0.49}Nb_{0.05}Cr_{0.12}W_{0.01}Si_{0.03}N$ | 2.2 | 2.05 | 1.00 |
| 9 | $Ti_{0.41}Al_{0.52}Cr_{0.04}Si_{0.03}N$ | 1.8 | 2.39 | 0.95 |

TABLE 4

| Test Specimen No | Droplet of Rake Face | | | | Droplet of Flank Face | | | | Ratio of Composition | | | Degree of Adhesion to Cutting Edge | Cutting Results | |
|---|---|---|---|---|---|---|---|---|---|---|---|---|---|---|
| | Number of Droplets | $Cr_{DR}$ | $Ti_{DR}$ | $Al_{DR}$ | Number of Droplets | $Cr_{DF}$ | $Ti_{DF}$ | $Al_{DF}$ | $Cr_{DR}/Cr_{DF}$ | $Ti_{DR}/Ti_{DF}$ | $Al_{DR}/Al_{DF}$ | | Number of Machined Workpieces | State of Flank Face |
| 1 | 27.2 | 21.7 | 25.8 | 52.5 | 20.2 | 20.5 | 28.0 | 51.5 | 1.06 | 0.92 | 1.02 | Very Low | 1880 | Normal Wear |
| 2 | 31.1 | 22.4 | 44.3 | 33.3 | 16.6 | 18.0 | 48.7 | 33.3 | 1.24 | 0.91 | 1.00 | Medium | 1120 | Normal Wear |
| 3 | 42.0 | 23.8 | 76.2 | — | 28.2 | 21.4 | 78.6 | — | 1.11 | 0.97 | — | Medium | 1150 | Normal Wear |
| 4 | 26.1 | 6.5 | 30.9 | 62.6 | 22.3 | 5.7 | 32.9 | 61.4 | 1.14 | 0.94 | 1.02 | Very Low | 1780 | Normal Wear |

TABLE 4-continued

| Test Specimen No | Droplet of Rake Face | | | | Droplet of Flank Face | | | | Ratio of Composition | | | Cutting Results | | |
|---|---|---|---|---|---|---|---|---|---|---|---|---|---|---|
| | Number of Droplets | $Cr_{DR}$ | $Ti_{DR}$ | $Al_{DR}$ | Number of Droplets | $Cr_{DF}$ | $Ti_{DF}$ | $Al_{DF}$ | $Cr_{DR}/Cr_{DF}$ | $Ti_{DR}/Ti_{DF}$ | $Al_{DR}/Al_{DF}$ | Degree of Adhesion to Cutting Edge | Number of Machined Workpieces | State of Flank Face |
| 5 | 19.3 | 6.1 | 46.5 | 47.5 | 15.3 | 4.6 | 47.9 | 47.5 | 1.33 | 0.97 | 1.00 | Low | 1450 | Normal Wear |
| 6 | 28.3 | 11.3 | 43.3 | 45.5 | 23.8 | 10.4 | 45.1 | 44.6 | 1.09 | 0.96 | 1.02 | Very Low | 1570 | Normal Wear |
| 7 | 23.7 | 9.2 | 47.4 | 43.4 | 16.8 | 7.0 | 52.1 | 41.0 | 1.31 | 0.91 | 1.06 | Low | 1250 | Normal Wear |
| 8 | 27.1 | 17.6 | 30.9 | 51.5 | 31.9 | 20.3 | 29.7 | 50.0 | 0.87 | 1.04 | 1.03 | High | 600 | Adhesion/Large Wear |
| 9 | 35.2 | 5.2 | 42.2 | 52.5 | 19.9 | 5.3 | 42.7 | 52.0 | 0.98 | 0.99 | 1.01 | High | 880 | Adhesion/Large Wear |

From the results illustrated in Tables 1 to 4, in a test specimen No. 9 in which the respective coating layers of the cutting edge and the flank face had the same Cr content ratio, and a test specimen No. 8 in which the coating layer for the flank face had a Cr content ratio greater than that of the cutting edge, the adhesion of the workpiece to the cutting edge was likely to occur, and the wear resistance of the flank face decreased, thereby wear of the flank face progressed early on.

In contrast, in any one of test specimens No. 1 to 7 according to the present invention, the adhesion of the workpiece to the cutting edge was low, the wear resistance was good, a flat machined surface was obtainable, and good cutting performance was demonstrated.

EXAMPLE 2

A base body was manufactured, and a coating layer was deposited in the same manner in EXAMPLE 1 except that the shape of the throwaway tip of the test specimen No. 1 of EXAMPLE 1 was changed to the shape of a throwaway tip of each of cutting tools LOMU100408ER-SM (LOMU-SM), BDMT11T308ER-JS (BDMT-JS), SEKW120308TN (SEKW), and SEKT1203 (SEKT) which were made by Kyocera Co. Similarly to EXAMPLE 1, the coating layer of each of the obtained test specimens was evaluated, and the cutting of the obtained test specimens was evaluated. Tables 5 to 8 illustrate the results.

TABLE 5

| Test Specimen No | Shape of Cutting Edge | | | Coating Layer | |
|---|---|---|---|---|---|
| | Shape | Back Rake Angle | Relief Angle | Composition of Rake Face | Thickness tr (μm) |
| 10 | LOMU-SM | 43° | 6° | $Ti_{0.27}Al_{0.53}Nb_{0.02}Cr_{0.16}W_{0.01}Si_{0.01}N$ | 1.9 |
| 11 | BDMT-JS | 25° | 18° | $Ti_{0.24}Al_{0.54}Nb_{0.03}Cr_{0.17}W_{0.01}Si_{0.01}N$ | 2.1 |
| 12 | SEKW | -(0°) | 20° | $Ti_{0.25}Al_{0.50}Nb_{0.03}Cr_{0.20}W_{0.01}Si_{0.01}N$ | 2.0 |
| 13 | SEKT | 50 | 20° | $Ti_{0.25}Al_{0.50}Nb_{0.03}Cr_{0.20}W_{0.01}Si_{0.01}N$ | 2.1 |

TABLE 6

| Test Specimen No | Coating Layer | | | Coating Layer | | | |
|---|---|---|---|---|---|---|---|
| | Composition of Cutting Edge | Thickness tc (μm) | | Composition of Flank Face | Thickness tf (μm) | tc/tf | tf/tr |
| 10 | $Ti_{0.30}Al_{0.40}Nb_{0.02}Cr_{0.26}W_{0.01}Si_{0.01}N$ | 4.5 | | $Ti_{0.26}Al_{0.55}Nb_{0.03}Cr_{0.14}W_{0.01}Si_{0.01}N$ | 3.5 | 1.29 | 1.84 |
| 11 | $Ti_{0.32}Al_{0.40}Nb_{0.03}Cr_{0.23}W_{0.01}Si_{0.01}N$ | 4.5 | | $Ti_{0.26}Al_{0.54}Nb_{0.03}Cr_{0.15}W_{0.01}Si_{0.01}N$ | 3.3 | 1.36 | 1.57 |
| 12 | $Ti_{0.25}Al_{0.49}Nb_{0.03}Cr_{0.21}W_{0.01}Si_{0.01}N$ | 4.1 | | $Ti_{0.24}Al_{0.51}Nb_{0.03}Cr_{0.20}W_{0.01}Si_{0.01}N$ | 3.0 | 1.37 | 1.50 |
| 13 | $Ti_{0.245}Al_{0.50}Nb_{0.03}Cr_{0.205}W_{0.01}Si_{0.01}N$ | 4.0 | | $Ti_{0.24}Al_{0.51}Nb_{0.03}Cr_{0.20}W_{0.01}Si_{0.01}N$ | 3.2 | 1.25 | 1.52 |

TABLE 7

| Test Specimen No | Droplet of Rake Face | | | | Droplet of Flank Face | | | | Ratio of Composition | | |
|---|---|---|---|---|---|---|---|---|---|---|---|
| | Number of Droplets | $Cr_{DR}$ | $Ti_{DR}$ | $Al_{DR}$ | Number of Droplets | $Cr_{DF}$ | $Ti_{DF}$ | $Al_{DF}$ | $Cr_{DR}/Cr_{DF}$ | $Ti_{DR}/Ti_{DF}$ | $Al_{DR}/Al_{DF}$ |
| 10 | 26.1 | 17.6 | 27.8 | 54.6 | 20.1 | 16.0 | 30.2 | 53.8 | 1.10 | 0.92 | 1.02 |
| 11 | 27.3 | 19.7 | 24.7 | 55.6 | 21.0 | 18.2 | 26.6 | 55.2 | 1.08 | 0.93 | 1.01 |
| 12 | 30.2 | 22.8 | 25.8 | 51.5 | 23.2 | 21.5 | 26.8 | 51.7 | 1.06 | 0.96 | 1.00 |
| 13 | 30.5 | 22.8 | 25.8 | 51.5 | 23.5 | 21.7 | 26.5 | 51.8 | 1.05 | 0.97 | 0.99 |

TABLE 8

| Test Specimen No | Cutting Results | | |
|---|---|---|---|
| | Degree of Adhesion to Cutting Edge | Number of Machined Workpieces | State of Flank Face |
| 10 | Very Low | 3000 | Normal Wear |
| 11 | Very Low | 2050 | Normal Wear |
| 12 | Medium | 950 | Normal Wear |
| 13 | Medium | 1200 | Normal Wear |

From the results illustrated in Tables 5 to 8, in test specimens No. 10 and 11, the back rake angles of which are 43° and 25°, respectively, the adhesion of a workpiece to the cutting edge is less than that in the test specimen No. 1, the wear resistance is good, and a flat machined surface is obtainable. In test specimens No. 12 and No. 13, each of which has a back rake angle close to 0°, the adhesion resistance of the cutting edge against a workpiece, and the wear resistance decrease compared to those in the test specimen No. 1.

REFERENCE SIGNS LIST

1: cutting tool
2: base body
3: rake face
4: flank face
5: cutting edge
6: coating layer
7: droplet
8: seating face

The invention claimed is:

1. A cutting tool, comprising a base body whose surface is coated with a coating layer made of $Cr_aM_{1-a}(C_{1-x}N_x)$ (here, M is at least one element selected from Ti, Al, Si, W, Mo, Ta, Hf, Nb, Zr, and Y, $0.01 \leq a \leq 0.4$, and $0 \leq x \leq 1$),
   wherein a cutting edge is formed on an intersection ridgeline between a rake face and a flank face,
   wherein the coating layer contains Ti and Al,
   wherein an Al content ratio of the coating layer for the rake face is greater than an Al content ratio of the coating layer for the cutting edge and is smaller than an Al content ratio of the coating layer for the flank face, and
   wherein a Cr content ratio of the coating layer for the rake face is smaller than a Cr content ratio of the coating layer for the cutting edge and is greater than a Cr content ratio of the coating layer for the flank face.

2. The cutting tool according to claim 1,
   wherein the coating layer has multiple layer structure with two or more layers that include a first coating layer containing Cr and a second coating layer not containing Cr.

3. The cutting tool according to claim 1,
   wherein a ratio (tc/tf) is 1.10 to 3.00, in which a thickness tf is the thickness of the coating layer for the flank face, and a thickness tc is the thickness of the coating layer for the cutting edge.

4. The cutting tool according to claim 1,
   wherein the back rake angle of the cutting edge on the rake face with respect to a seating face is 20° to 50°.

* * * * *

UNITED STATES PATENT AND TRADEMARK OFFICE
CERTIFICATE OF CORRECTION

PATENT NO.       : 9,643,257 B2                        Page 1 of 1
APPLICATION NO.  : 14/410572
DATED            : May 9, 2017
INVENTOR(S)      : Yoshiki Sakamoto It is certified that error appears in the above-identified patent and that said Letters Patent is hereby corrected as shown below:

Line 66, Column 4, delete "$0\leq\leq c\leq 0.58$" and insert --$0\leq c\leq 0.58$-- therefor.

Column 12, please replace table 5 with the below table.

[Table 5]

| Test Specimen No | Shape of Cutting Edge | | | Coating Layer | |
|---|---|---|---|---|---|
| | Shape | Back Rake Angle | Relief Angle | Composition of Rake Face | Thickness tr (μm) |
| 10 | LOMU-SM | 43° | 6° | $Ti_{0.27}Al_{0.53}Nb_{0.02}Cr_{0.16}W_{0.01}Si_{0.01}N$ | 1.9 |
| 11 | BDMT-JS | 25° | 18° | $Ti_{0.24}Al_{0.54}Nb_{0.03}Cr_{0.17}W_{0.01}Si_{0.01}N$ | 2.1 |
| 12 | SEKW | -(0°) | 20° | $Ti_{0.25}Al_{0.50}Nb_{0.03}Cr_{0.20}W_{0.01}Si_{0.01}N$ | 2.0 |
| 13 | SEKT | 5° | 20° | $Ti_{0.25}Al_{0.50}Nb_{0.03}Cr_{0.20}W_{0.01}Si_{0.01}N$ | 2.1 |

Signed and Sealed this
Tenth Day of April, 2018

Andrei Iancu
*Director of the United States Patent and Trademark Office*